(12) United States Patent
Manganaro (10) Patent No.: US 6,570,410 B2
(45) Date of Patent: May 27, 2003

(54) FEED-FORWARD APPROACH FOR TIMING SKEW IN INTERLEAVED AND DOUBLE-SAMPLED CIRCUITS

(75) Inventor: Gabriele Manganaro, Coppell, TX (US)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 10/105,681

(22) Filed: Mar. 25, 2002

(65) Prior Publication Data

US 2002/0190774 A1 Dec. 19, 2002

Related U.S. Application Data

(62) Division of application No. 09/880,551, filed on Jun. 13, 2001.

(51) Int. Cl.[7] .............................................. G11C 27/02
(52) U.S. Cl. ............................. 327/94; 327/95; 327/96; 327/337
(58) Field of Search ............................. 327/91, 94, 95, 327/96, 337, 554, 256–259, 291, 293, 295; 341/122

(56) References Cited

U.S. PATENT DOCUMENTS

| 5,142,236 A | * | 8/1992 | Maloberti et al. | ............ 327/91 |
| 5,281,860 A | * | 1/1994 | Krenik et al. | ............... 327/91 |
| 5,416,432 A | * | 5/1995 | Lewis et al. | .................. 327/94 |
| 5,495,199 A | * | 2/1996 | Hirano | ....................... 327/337 |
| 6,268,815 B1 | * | 7/2001 | Gustavsson et al. | ........ 341/143 |
| 6,380,806 B1 | * | 4/2002 | Ang | ............................. 330/258 |

OTHER PUBLICATIONS

Waltari, et al., "Timing Skew Insenitive Switching For Double–Sampled Circuits", Electronic Circuit Design Laboratory, Helsinki University of Technology, Finland, 1999 IEEE, pp 11–61–11–64.

Sumanen, et al., "A 10–bit 200 MS/s CMOS Parallel Pipeline A/D Convertor", Helsinki University of Technology, Electronic Circuit Design Laboratory, Finland 4 pages.

Gustavsson, et al., "A Global Passive Sampling Technique for High–Speed Swithced–Capacitor Time Interleaved ADCs", IEEE Transactions on Circuits and Systems—II: Analog and Digital Signal Processing, vol. 47, No. 9, Sep., 2000, pp. 821–831.

Park, et al., "8.3 A 10b100Msample/s CMOS Pipelined ADC with 1.8V Power Supply", 2001 IEEE International Solid–State Circuits Conference, 3 pages.

* cited by examiner

Primary Examiner—Terry D. Cunningham
Assistant Examiner—Long Nguyen
(74) Attorney, Agent, or Firm—W. Daniel Swayze, Jr.; W. James Brady; Frederick J. Telecky, Jr.

(57) ABSTRACT

The present invention relates to a clock generator circuit which comprises a clock generator subcircuit which is operable to generate two clock signals having approximately the same frequency for use in sampling an analog signal in a generally alternating fashion. The clock generator circuit further comprises a pre-phase clock generator subcircuit associated with the clock generator subcircuit which is operable to generate two pre-phase clock signals, wherein each are associated with a respective one of the two clock signals generated by the clock generator subcircuit. In the pre-phase clock generator circuit, a signal transition of each of the pre-phase clock signals occurs before a signal transition of the respective clock signal generated by the clock generator subcircuit; in addition, a timing of a falling edge of the pre-phase clock signals is dictated by a global clock signal. Thus the clock generator circuit avoids sampling error in a double-sampled sample and hold circuit and harmonic distortion associated therewith.

5 Claims, 5 Drawing Sheets

FEED-FORWARD APPROACH FOR TIMING SKEW IN INTERLEAVED AND DOUBLE-SAMPLED CIRCUITS

This application is a divisional of application Ser. No. 09/880,551 filed Jun. 13, 2001.

FIELD OF THE INVENTION

The present invention relates generally to the field of integrated circuits, and more particularly to a system and method of generating timing signals in interleaved and/or double-sample circuits to eliminate timing skew or timing mismatch errors associated therewith.

BACKGROUND OF THE INVENTION

Analog to digital converters (ADCs) are important analog circuit devices which take an analog input signal and generate one or more digital signals which are representative of the analog input. ADCs are used in many applications such as communications applications in which the components receive a voice input (an analog input) and transform the voice data into a digital format for subsequent processing.

In many telecommunication applications, high-speed, high-resolution ADCs are needed. High resolutions of 14 bits or greater have been achieved using over-sampling sigma-delta converters and pipelined converters, but the signal bandwidth is typically limited to a few megahertz (MHz). By using time-interleaved ADCs, high sampling rates can be achieved. Note that in prior art FIG. 1, a traditional non-interleaved ADC system 10 is illustrated. In the ADC system 10, an analog input signal 12 is sampled by the ADC at a sampling frequency $f_S$ to provide a digital type output 14. Note, however, that the ADC system 10 is limited by how fast the circuitry therein can operate. Therefore the sampling frequency $f_S$ is limited, thereby limiting the conversion rate thereof.

Figures 1, 2, 3, 4:
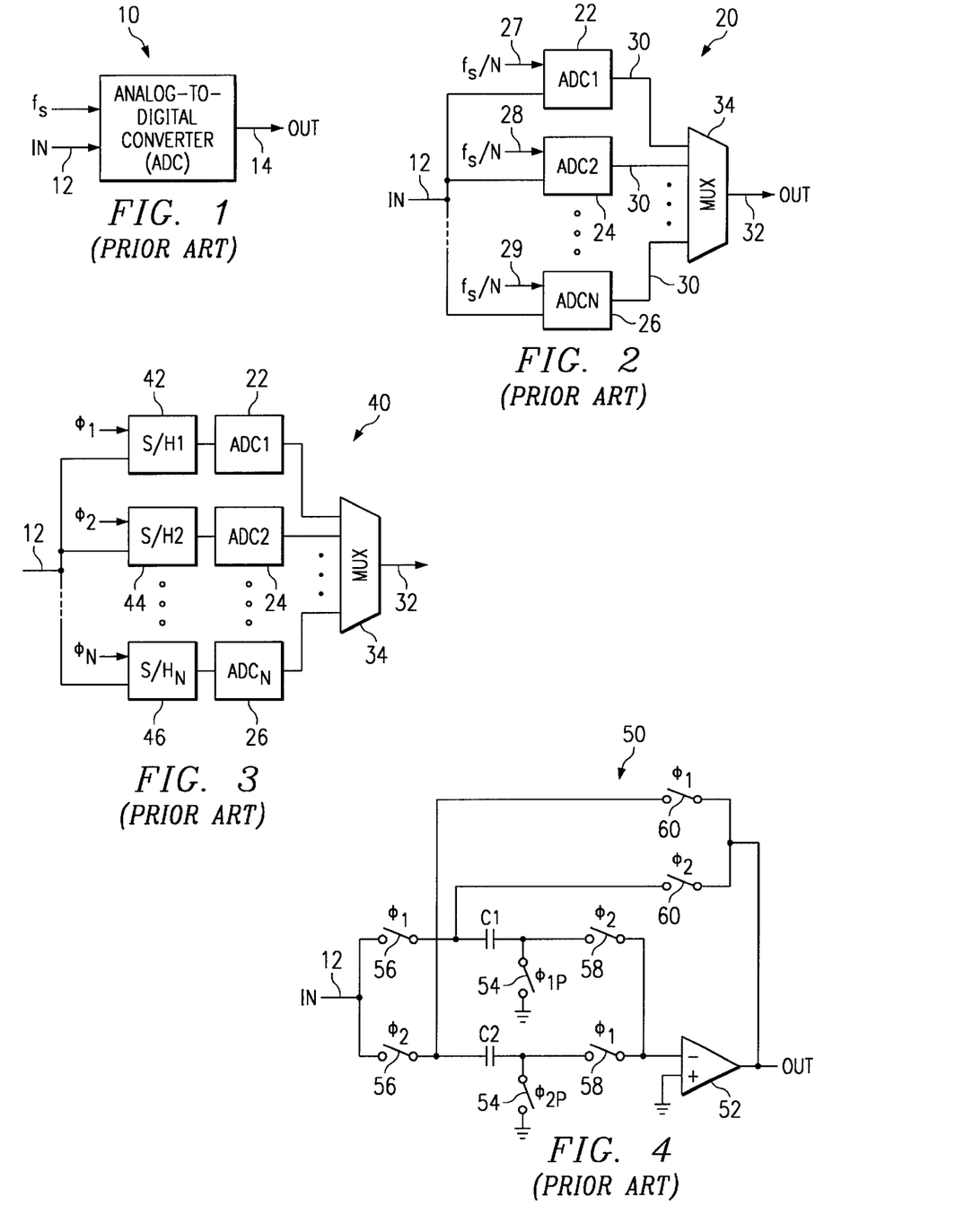
FIG. 1 is a prior art block diagram illustrating a conventional analog-to-digital converter (ADC)
FIG. 2 is a prior art combined block diagram and schematic diagram illustrating a conventional interleaved ADC circuit.
FIG. 3 is another prior art combined block diagram and schematic diagram illustrating a conventional interleaved ADC circuit having sample and hold circuits associated with each of the parallel ADC subcircuits.
FIG. 4 is a prior art schematic diagram illustrating a double-sampled sample and hold circuit which employs two parallel sampling circuits in conjunction with a single operational amplifier.

Turning now to prior art FIG. 2, the conversion rate of an ADC system 20 is increased substantially by a time-interleaving technique, wherein several ADCs, 22, 24 and 26 operate in parallel using different clock phases 27, 28 and 29, respectively. This time-interleaving technique enables a higher conversion speed since each of the individual ADCs 22, 24 and 26 need only operate at a sampling rate $f_S/N$, wherein N is an integer representing the number of parallel-operating ADCs. Each of the digital outputs 30 from the ADCs 22, 24 and 26 are then brought together to form a digital output 32 via a multiplexer 34, as illustrated. Thus the system 20 provides a total sampling frequency of $f_S$, while each of the individual ADCs need only operate at $f_S/N$. Thus the total sampling frequency $f_S$ may be increased.

The performance of the time-interleaved converter system 20 of prior art FIG. 2 is limited by the accuracy of each channel ADC 22, 24 and 26; however, there are additional errors that may arise in the sampled output 32 which are caused by mismatch between the channels. The three chief types of mismatch associated with time-interleaved converters are offset mismatch, gain mismatch and timing mismatch (which is often referred to as phase skew error). The offset and gain mismatch errors are relatively easy to resolve, for example, via calibration in either the analog or digital domain. Phase skew errors, however, are not easily calibrated, since dynamic input signals are required to measure the delay skews. Furthermore, even a small phase skew of as little as 25 ps may limit the input frequency of a 10-bit converter to less than 10 MHz.

Due to the difficulties in calibrating delay skews, a passive sampling technique has been employed in conventional circuits. For example, as illustrated in FIG. 3, an ADC system 40 employs passive sampling circuits such as sample and hold circuits 42, 44 and 46 in series with each of the sub-ADCs 22, 24 and 26, respectively. Each of the sample and hold circuits 42, 44 and 46 are operable to sample the analog input 12 based on their unique clock phase ($\phi_1, \phi_2, \ldots \phi_N$). Although the solution 40 of prior art FIG. 3 does reduce phase skew error, such phase skew error or timing mismatch is not fully eliminated; instead such error still exists when the N different clock phases themselves are generated to drive the sample and hold circuits 42, 44 and 46. Even small differences in delay between the various clock phases may generate substantial distortion at high signal frequencies.

The sample and hold circuits 42, 44 and 46 discussed above in conjunction with the exemplary system of prior art FIG. 2 are single sample type circuits, in which a single sample of the analog input is taken for each clock cycle of its respective sampling clock (e.g., $\phi_1$ for circuit 42). In order to further improve the sampling speed of sample and hold circuits, a double-sampling type sample and hold circuit has been developed, as illustrated in prior art FIG. 4 and designated at reference numeral 50. The circuit 50 uses both the rising edge and falling edge of a sampling clock (and thus generally opposite or complimentary phases $\phi_1$ and $\phi_2$) to efficiently utilize an op-amp 52 associated therewith. For example, when $\phi_1$ is high, the analog input 12 is sampled on $C_1$, while $C_2$ is holding a previous sample via a feedback connection of the op-amp 52. Similarly, when $\phi_2$ goes high and $\phi_1$ goes low, the input 12 is sampled on $C_2$ while the sample previously associated with $C_1$ is held via the op-amp feedback configuration.

Note, however, that two additional signals $\phi_{1P}$ and $\phi_{2P}$ drive respective switches 54 that selectively couple the second terminal of the capacitors $C_1$ and $C_2$, respectively, to circuit ground. These signals are pre-phase signals and initiate the sample instant when their signals go low, such that the respective capacitor is decoupled from ground. Shortly thereafter, the corresponding switch 56 connected to the input 12 is turned off, and the respective switches 58 and 60 are turned on, thus connecting the respective sampling capacitor into the feedback loop. This technique is referred to as bottom plate sampling and aids in avoiding signal dependent errors which may otherwise occur if the sample had been taken by first closing the switches 56 between the capacitors $C_1$ and $C_2$ and the input 12.

Figure 5:
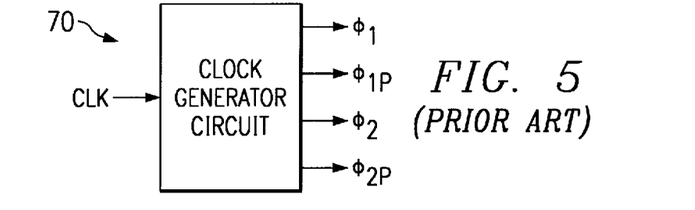
FIG. 5 is a prior art block diagram of a clock generator circuit used for generating clock phase signals for the double-sampled sample and hold circuit of FIG. 4.

As can be seen from the above, the double-sampled circuit 50 has two parallel signal paths and timing mismatch therebetween may introduce some errors at the output. For example, timing skew in the clock signals for the parallel channels leads to non-uniform sampling. Such timing skew may result from unmatched propagation delays from a clock generator circuit to the switches or may originate within the clock generator itself. One exemplary prior art clock signal generator is illustrated in prior art FIGS. 5 and 6, and is designated at reference numeral 70. As illustrated in FIG. 5, the clock generator circuit 70 is operable to take a single input clock signal CLK and generate four phase signals $\phi_1$, $\phi_{1P}$, $\phi_2$ and $\phi_{2P}$ associated therewith.

Figure 6:
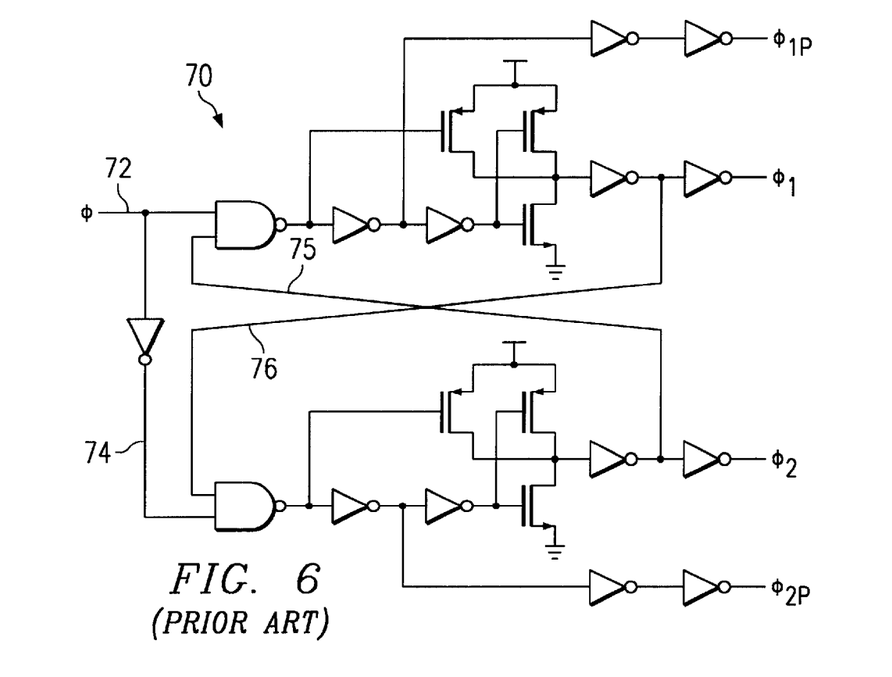
FIG. 6 is a prior art schematic diagram illustrating in greater detail the clock generator circuit of FIG. 5.
Figure 7:
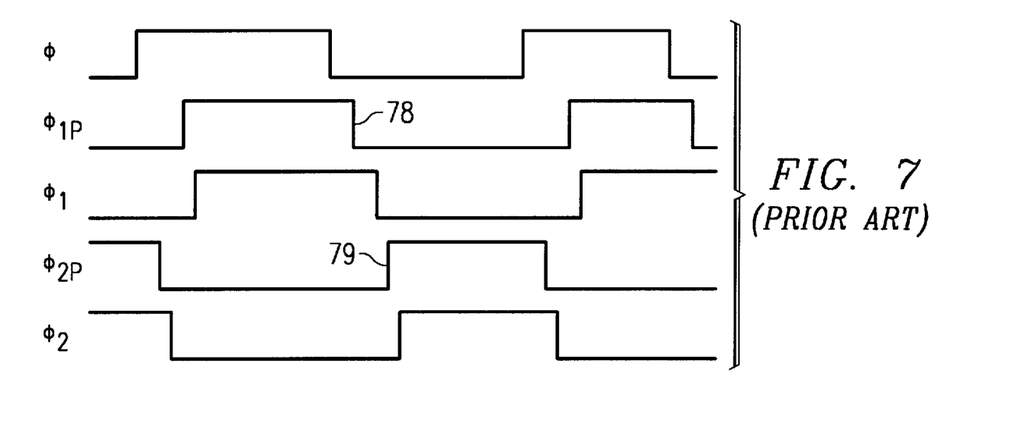
FIG. 7 is a timing diagram illustrating the various clock phase signals generating by the prior art clock generator circuit of FIG. 6.

As illustrated in prior art FIG. 6, an input clock signal $\phi$ 72 and its compliment $\phi_Z$ 74 each drive parallel signal paths which employ a cross-coupled feedback feature via signals 75 and 76, as illustrated. In the clock generator circuit 70 of prior art FIG. 6, the pre-phase signals $\phi_{1P}$ and $\phi_{2P}$ are a function of the cross-coupled feedback loops and have differing pulse widths, as illustrated in the timing diagram of FIG. 7. Therefore the falling edge 78 of $\phi_{1P}$ and the falling edge 79 of $\phi_{2P}$ are skewed with respect to an ideal sampling clock, running at twice their frequency, and defining the sampling times for the input signal 12 of FIG. 3. This difference causes a systematic periodic sampling pattern, which results in a phase modulation of the input samples and thus leads to harmonic distortion on the output of the double-sample circuit 50 of prior art FIG. 4.

Figure 8:
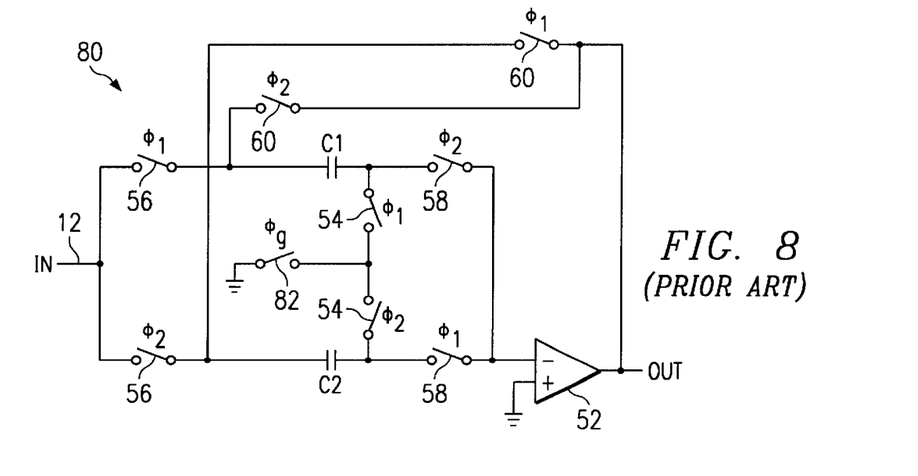
FIG. 8 is a prior art schematic diagram illustrating a double-sampled sample and hold circuit employing a global switch to minimize harmonic distortion due to timing mismatch or skew.

One conventional solution to the above problem is illustrated in prior art FIG. 8, wherein a double-sampled sample and hold circuit 80 is provided. The circuit 80 is similar to the circuit 50 of prior art FIG. 4, except that the switches 54 are no longer driven by pre-phase signals $\phi_{1P}$ and $\phi_{2P}$, but instead are driven by standard signals $\phi_1$ and $\phi_2$. The timing instant of each sample in circuit 80, however, is not dictated by $\phi_1$ and $\phi_2$, but instead is dictated by a global sampling clock signal $\phi_g$ which drives a switch 82 that is in series with each of the switches 54. Therefore, the sampling instant for both $C_1$ and $C_2$ is dictated by the falling edge of $\phi_g$, the same clock signal, and therefore the phase modulation of the input samples and the output harmonic distortion associated therewith is eliminated.

The circuit 80 of prior art FIG. 8 overcomes some problems, however, the solution also creates new performance difficulties. In circuit 80, two switches (switch 54 and switch 82) are connected in series from a capacitor terminal to circuit ground. The additional switch 82 introduces additional parasitic capacitance which causes distortion on the output which can not be removed. Therefore the circuit solution 80 of prior art FIG. 8 is unsatisfactory.

There is a need in the art for a method of providing high speed sampling without harmonic distortion on the output of sampling circuits.

SUMMARY OF THE INVENTION

The present invention relates generally to a high speed sample and hold system which reduces substantially or eliminates completely harmonic distortion due to timing mismatch or skew associated therewith.

According to one aspect of the present invention, a clock generator circuit is disclosed which provides clock signals which may be employed in double-sampled sample and hold circuits to control a switching network for sampling an analog signal on two generally parallel sampling circuits in an alternating fashion. The clock generator circuit also generates pre-phase signals which dictate a sampling instant associated with the respective sampling circuits. In contrast with conventional clock generation circuits, the pre-phase signals of the clock generator circuit of the present invention are not derived from within a set of cross-coupled feedback loops, but instead having a timing which is dictated by a global clock signal. Therefore the falling edges of the pre-phase signals which are used to define the sampling instants are both dictated by the global sampling clock and thus timing mismatch and any phase modulation associated therewith is reduced or eliminated altogether.

According to another aspect of the present invention, a clock generator circuit comprises a clock generator subcircuit which is operable to generate two phase clock signals which may be used to control a sampling of an analog signal and a hold of such sample among two generally parallel sampling circuits which interface with an operational amplifier via a switching network. In the above manner, the two phase clock signals are operable to sample the analog signal on a capacitor associated with one of the sampling circuits while a previous sample is held by the other sampling circuit in a feedback configuration with the operational amplifier. Further, the two phase clock signals are operable to switch such functionality between the generally parallel sampling circuits in an alternating fashion to thereby make efficient use of the operational amplifier.

The clock generator circuit further comprises a pre-phase clock generator subcircuit which is operably associated with the clock generator subcircuit. The pre-phase clock generator subcircuit is operable to generate two pre-phase clock signals, wherein each of the pre-phase signals is associated with a respective one of the generally parallel sampling circuits and are operable to define a sampling instant by controlling a switch in the respective sampling circuit which decouples a sampling capacitor from a predetermined potential such as circuit ground. The pre-phase clock generator subcircuit is operable to generate the pre-phase signals such that a determinative signal transition thereof occurs before a signal transition of each respective phase clock signal generated by the clock generator subcircuit, and such pre-phase signals have a falling edge timing that is dictated by a global sampling clock, thereby advantageously reducing or eliminating timing mismatch between the generally parallel sampling circuits.

In accordance with yet another aspect of the present invention, the pre-phase clock generator subcircuit further comprises a pulse generator circuit coupled to the global sampling clock and operable to generate a pulse having a timing associated therewith. The pre-phase clock generator subcircuit further comprises a pull down circuit operably coupled to the pulse generator circuit which is operable to pull nodes associated with the clock generator subcircuit down to low logic states, and from which logic states the respective pre-phase signals are generated.

Thus the present invention avoids harmonic distortion due to timing mismatch or skew associated with conventional solutions which relied upon a global sampling switch in double-sampled sample and hold circuits to avoid sampling error (but which instead created distortion due to the additional parasitic capacitance of the added global sampling switch). The present invention instead generates pre-phase signals in the clock generator circuit with a global clock signal. Therefore a timing of the global falling edge of each pre-phase signal which defines the sampling instant is dictated by the same global clock signal, which prevents sampling error in the parallel sampling circuits and harmonic distortion associated therewith.

To the accomplishment of the foregoing and related ends, the invention comprises the features hereinafter fully described and particularly pointed out in the claims. The following description and the annexed drawings set forth in detail certain illustrative aspects and implementations of the invention. These are indicative, however, of but a few of the various ways in which the principles of the invention may be employed. Other objects, advantages and novel features of the invention will become apparent from the following detailed description of the invention when considered in conjunction with the drawings.

DETAILED DESCRIPTION OF THE INVENTION

The present invention will now be described with respect to the accompanying drawings in which like numbered elements represent like parts. The present invention is directed to a double-sampled sample and hold system which employs a clock generator circuit which generates pre-phase signals in accordance with a single global clock signal. The pre-phase signals are then employed in conjunction with a double-sampled sample and hold circuit to define the sampling instants of respective, parallel sampling circuits. Therefore sampling error in the parallel sampling circuits is avoided, thereby eliminating harmonic distortion heretofore associated with such sampling error. In addition, by use of a global clock signal in the clock generator circuit, a conventional double-sampled sample and hold circuit architecture may be maintained, thereby simplifying the circuit design and avoiding distortion due to additional switches that were used in conventional design solutions to avoid sampling error due to timing mismatch or skew.

Figure 9:
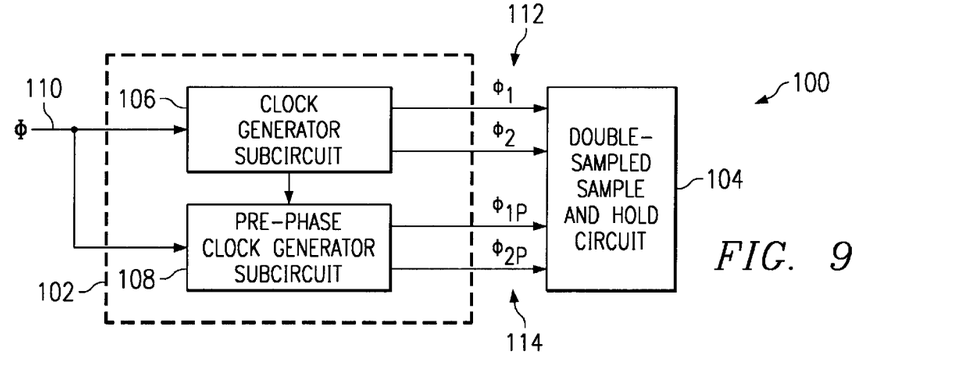
FIG. 9 is a block diagram illustrating a double-sampled sample and hold system employing a clock generator circuit according to an aspect of the present invention.

Turning now to the figures, FIG. 9 is a block diagram illustrating a double-sampled sample and hold system 100 having a clock generator circuit 102 operably coupled or otherwise associated with a double-sampled sample and hold circuit 104. According to one exemplary aspect of the present invention, the clock generator circuit 102 comprises a clock generator subcircuit 106 and a pre-phase clock generator subcircuit 108, respectively. Both the clock generator subcircuit 106 and the pre-phase clock generator subcircuit 108 receive a global clock signal 110 ($\Phi$) and employ the global clock signal to generate phase clock signals 112 and pre-phase signals 114, respectively. In particular, the clock generator subcircuit 106 is operable to generate two phase clock signals 112 which have approximately the same frequency and which are a function of the global clock signal frequency, and such signals are subsequently employed to control a switching network for the sampling of an analog signal using two parallel sampling circuits in an alternating type fashion.

In addition, the pre-phase signals 114 generated by the pre-phase clock generator subcircuit 108 exhibit signal transitions which occur a small time period before corresponding signal transitions of the respective phase clock signals 112. Further, the timing of the falling edge of each of the pre-phase signals 114 is dictated by the same global clock signal 110. As will be discussed later in greater detail, having the timing of the falling edge of each pre-phase signal 114 generated by the same global clock signal is advantageous since the falling edge of the pre-phase signals are employed by the double-sampled sample and hold circuit 104 to determined the sampling instant for each of the parallel sampling circuits contained therein. Thus no sampling error occurs and harmonic distortion associated with such sampling error is eliminated.

One advantageous feature of the present invention is that the system 100 may employ a conventional double-sampled sample and hold circuit 104. Consequently, if such a circuit 104 already exists in an integrated circuit ASIC library as a standard cell, for example, such a cell can be imported into the integrated circuit design easily without needing to make changes to such circuitry. A more detailed discussion of the double-sampled sample and hold circuit 104 will now be discussed in conjunction with FIG. 10 in order to appreciate how the clock generator circuit 102 of the present invention improves system performance by eliminating harmonic distortion due to sampling error.

Figure 10:
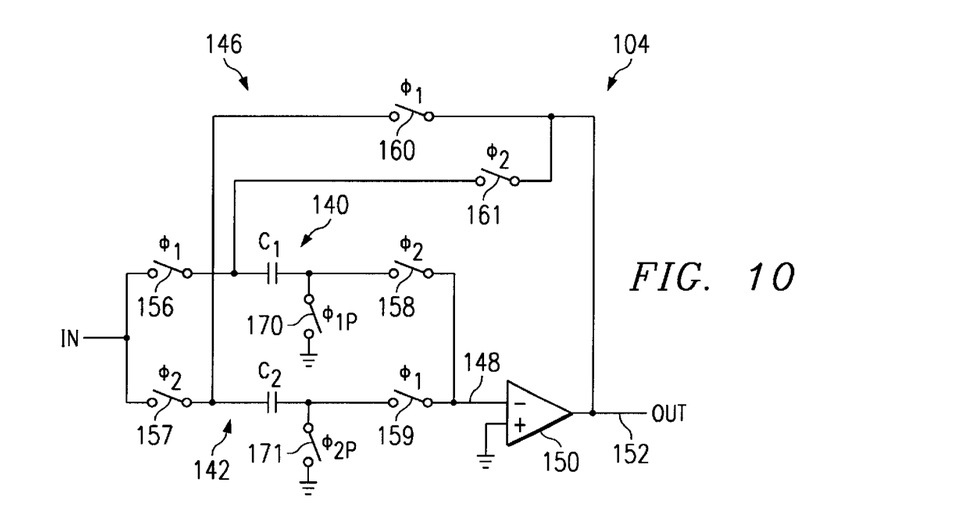
FIG. 10 is a schematic diagram illustrating a double-sampled sample and hold circuit which may be employed in the system of FIG. 9 according to the present invention.

In FIG. 10, the double-sampled sample and hold circuit 104 has two generally parallel sampling circuits 140 and 142 containing sampling capacitors $C_1$ and $C_2$, which sample and hold an analog input signal 144 in an alternating fashion. Further, the circuit 104 effectuates such functionality through a switching network 146 that operates in conjunction with the phase clock signals $\phi_1$ and $\phi_2$ to couple one capacitor (e.g., $C_1$) between the analog input 144 and ground in a sampling mode, while the other capacitor (e.g., $C_2$) is connected between an inverting input 148 of an operational amplifier 150 and an output 152 thereof in a feedback configuration. In particular, the switching network 146 includes switches 156 and 157 between the analog input 144 and a first terminal of the sampling capacitors $C_1$ and $C_2$, respectively, and a second set of switches 158 and 159 between the second terminals of the capacitors and the inverting input 148 of the op-amp 150. Lastly, the switching network 146 includes switches 160 and 161 between the first terminals of the respective capacitors and the output 152 of the op-amp 150.

The phase clock signals $\phi_1$ and $\phi_2$ from the clock generator circuit 102 operate generally out of phase with one another such that when $\phi_1$ is high, $\phi_2$ generally is low, and vice-versa. In addition to the switches highlighted above, the circuit 104 includes switches 170 and 171 which are located between the second terminal of a respective sampling capacitor and a voltage potential such as circuit ground. The switches 170 and 171 are controlled by the pre-phase signals $\phi_{1P}$ and $\phi_{2P}$ (114), respectively, which generally mirror their corresponding phase clock signals $\phi_1$ and $\phi_2$, however, a falling edge of the pre-phase signals 114 define the sampling instants of each of the parallel sampling circuits.

In operation, when $\phi_1$ and $\phi_{1P}$ are high and $\phi_2$ and $\phi_{2P}$ are low, switches 156, 159, 160 and 170 are closed, and switches 157, 158, 161 and 171 are open, respectively. In this instance, the analog input 144 is coupled across the sampling capacitor $C_1$ to ground, thereby sampling the input in one of the parallel sampling circuits 140. At the same time, the voltage across $C_2$, representing a previous sample of the analog input 144, is held in a feedback configuration between the inverting input 148 and the output 152 of the op-amp 150. When $\phi_{1P}$ goes low, the switch 170 opens, thereby disconnecting the second terminal of the capacitor $C_1$ from ground, and prohibiting additional charging of thereof due to the open circuit condition. Thus the falling edge of $\phi_{1P}$ which opens the switch 170 defines the sampling instant for the one parallel sampling circuit 140.

Subsequently, after a short time period, $\phi_{1P}$ goes low, thereby opening switches 156, 159 and 160. When $\phi_2$ and $\phi_{2P}$ go high (corresponding generally with the falling edges of $\phi_1$ and $\phi_{1P}$) the switches 157, 158, 161 and 171 are closed such that the sampling mode and hold modes of the parallel sampling circuits are switched. When $\phi_{2P}$ subsequently goes low, the switch 171 opens which defines the sampling instant of its respective sampling circuit 142 and the parallel sampling circuits 140 and 142 switch back and forth between sample and hold modes in an alternating fashion. Thus it is seen from the discussion of FIG. 10 that the pre-phase signals $\phi_{1P}$ and $\phi_{2P}$, respectively, define the sampling instants for the two parallel sampling circuits 140 and 142.

Figure 11:
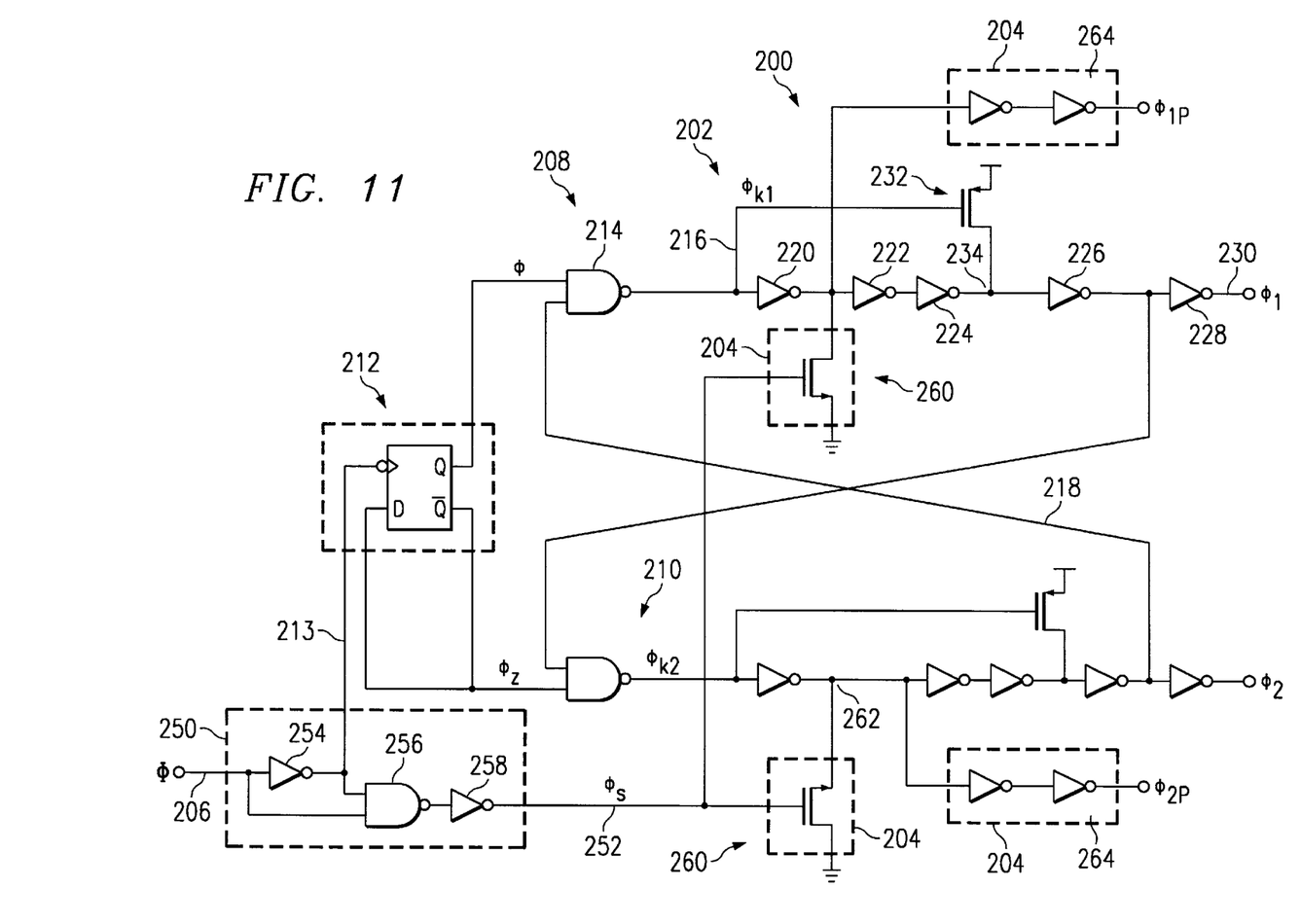
FIG. 11 is a schematic diagram illustrating in greater detail the clock generator circuit of FIG. 9 according to another aspect of the present invention.

Turning now to FIG. 11, according to one exemplary aspect of the present invention, a schematic diagram corresponding to the clock generator circuit 102 of FIG. 9 is provided, and designated at reference numeral 200. The clock generator 200 of FIG. 11 comprises a clock generator subcircuit portion 202 and a pre-phase clock generator portion 204, respectively. Both portions 202 and 204 are driven by a global clock signal 206, as illustrated. The clock generator subcircuit portion 202 operates in a manner similar to the conventional clock generator circuit 70 of prior art FIG. 6, except that a first clock signal path portion 208 and a second signal path portion 210 are driven by a latch system 212 which receives a signal 213 which is an inverted version of the global clock signal 206, and which outputs complimentary clock signals $\phi$ and $\phi_Z$ therefrom. The latch system 212 advantageously provides the complimentary clock signals $\phi$ and $\phi_Z$ to the signal path portions 208 and 210 in a synchronous fashion. Note that in contrast to the present invention, with the prior art circuit 70 of FIG. 6, such complimentary signals are out of phase with one another by an amount associated with the inverter employed to generate the complimentary clock signal $\phi_Z$.

According to one aspect of the invention, both signal path portions 208 and 210 operate in a similar fashion. For example, a NAND gate 214 generates an output signal 216 (e.g., $\phi_{K1}$) which is a function of a clock signal (e.g., $\phi$) and a feedback signal 218 which is a function of the output of the other signal path, as illustrated. The output signal 216 then propagates through a plurality of inverters 220, 222, 224, 226 and 228 to form an output signal 230 of one of the signal path portions (e.g., $\phi_1$). The signal 216 also drives a gate of a pull-up circuit 232 (e.g., a PMOS transistor), thereby pulling a circuit node 234 up to a supply voltage value when the signal 216 goes low.

Therefore in operation, the signal 216 goes low when $\phi$ is high and when $\phi_2$ is low (feedback signal 218 is generally the inverse of $\phi_2$), thus pulling the node 234 high and thus $\phi_1$ goes high via the inverters 226 and 228. In this manner, $\phi_1$ and $\phi_2$ are complimentary and switch at about the same time. At other conditions when signal 216 is high, the other feedback signal is high and $\phi_1$ is low.

The pre-phase clock generator subcircuit 204 is driven by the global clock signal 206 via a pulse generator circuit 250. The pulse generator circuit 250 generates a pulse signal 252 ($\phi_S$) which has a pulse width dictated by a propagation delay of an inverter 254 associated therewith, as illustrated, for example, in the timing diagram of FIG. 12. That is, the global clock signal 206 drives a NAND gate 256 directly and through the inverter 254, respectively, thereby generating a negative pulse which is then inverted by another inverter 258. Thus the pulse signal 252 has a timing dictated by a rising edge of the global clock signal 206, as illustrated, and a pulse width associated with the inverter 254. In addition, the pulse signal 252 has a frequency which is the same as the global clock signal 206.

The pulse signal 252 drives a gate terminal of a pull-down circuit 260 (e.g., an NMOS transistor) associated with each of the clock signal paths 208 and 210, respectively. Each of the pull-down circuits 260 are operable to pull down a circuit node 262 associated with the respective signal paths 208, 210 based on a state of the pulse signal 252. For example, according to one exemplary aspect of the present invention, when the pulse signal 252 goes high and the circuit node 262 associated with a given pull-down circuit is high, the transistor turns on, thus pulling the respective node 262 down to a circuit ground potential.

The pre-phase clock generator subcircuit 204 further comprises a delay circuit 264 which is coupled to the circuit node 262 of each signal path 208 and 210, respectively. Each delay circuit 264 is operable to receive the signal at the circuit node 262 as an input signal and provide such signal at its output with a predetermined delay associated therewith to generate the pre-phase signals $\phi_{1P}$ and $\phi_{2P}$, respectively. In accordance with one exemplary aspect of the present invention, the delay circuit 264 comprises a buffer composed of two serially-coupled inverters, however, any form of delay circuitry may be employed and is contemplated as falling within the scope of the present invention.

Figure 12:
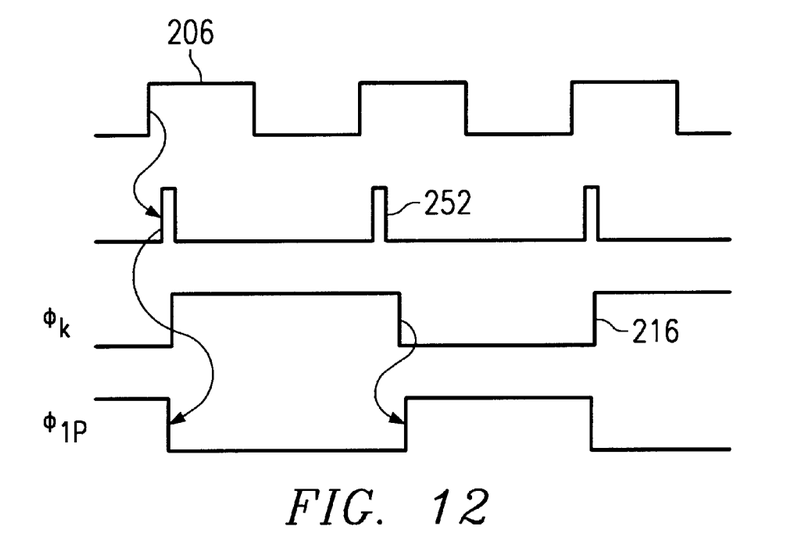
FIG. 12 is a timing diagram illustrating the various clock phase signals generated by the clock generator circuit according to the present invention.

The pre-phase clock generator subcircuit 204 advantageously operates outside the feedback loop functionality of the clock generator subcircuit 202, and thus in one sense the pre-phase clock generator subcircuit 204 operates in a feedforward type fashion. Note that both pre-phase signals $\phi_{1P}$ and $\phi_{2P}$ have falling edges that are dictated by the same global clock signal 206 (e.g., via the pulse signal 252 from the pulse generator circuit 250 as illustrated in FIG. 12). Thus the sampling instants in a double sampled sample and hold circuit which are defined by the falling edges of the pre-phase signals $\phi_{1P}$ and $\phi_{2P}$ are consistently defined and such operation avoids the harmonic distortion heretofore attributable to timing skew. Furthermore, by the use of the present invention, harmonic distortion due to additional parasitics in switched capacitor circuit global sampling switches is avoided. In addition, the present invention allows for use of traditional switched capacitor circuits to sample an analog signal in an efficient manner.

Figure 13:
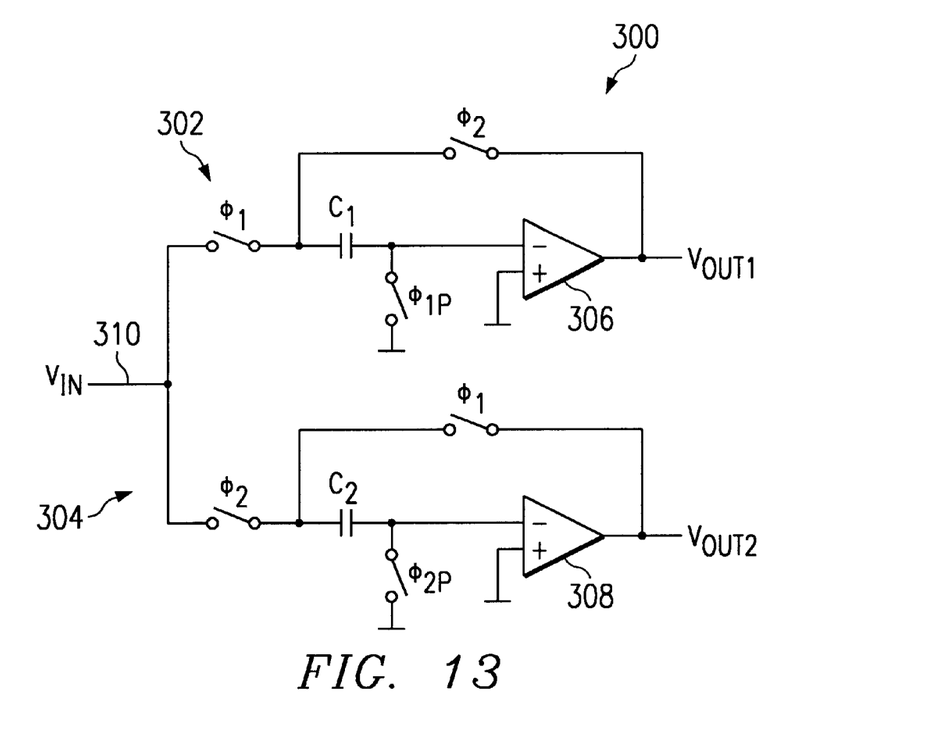
FIG. 13 is a schematic diagram of another type of double-sampled sample and hold circuit which may employ the clock generator circuit of the present invention.

According to another aspect of the present invention, the clock generator circuit 102, 200 of FIGS. 9 and 10, respectively, may be employed in conjunction with another sample and hold type circuit, such as that illustrated in FIG. 13, and designated at reference numeral 300. The circuit 300 of FIG. 13 operates in a manner similar to the circuit 104 of FIG. 10, except that two parallel sampling circuits 302 and 304 employ their own amplifiers 306 and 308, respectively. An analog input signal 310 is sampled successively by the parallel sampling circuits 302 and 304 in accordance with a timing dictated by the phase clock signals $\phi_1$, $\phi_{1P}$, $\phi_2$, and $\phi_{2P}$. Instead of a single amplifier being used, each parallel circuit 302, 304 uses its own amplifier 306 and 308. Similarly, the falling edges of the pre-phase signals $\phi_{1P}$ and $\phi_{2P}$ define the sampling instants and since the clock generator 200 generates the pre-phase signals with falling edges dictated by a global sampling clock, sampling error is avoided.

Although the invention has been shown and described with respect to a certain aspect or various aspects, it is obvious that equivalent alterations and modifications will occur to others skilled in the art upon the reading and understanding of this specification and the annexed drawings. In particular regard to the various functions performed by the above described components (assemblies, devices, circuits, etc.), the terms (including a reference to a "means") used to describe such components are intended to correspond, unless otherwise indicated, to any component which performs the specified function of the described component (i.e., that is functionally equivalent), even though not structurally equivalent to the disclosed structure which performs the function in the herein illustrated exemplary embodiments of the invention. In addition, while a particular feature of the invention may have been disclosed with respect to only one of several aspects of the invention, such feature may be combined with one or more other features of the other aspects as may be desired and advantageous for any given or particular application. Furthermore, to the extent that the term "includes" is used in either the detailed description or the claims, such term is intended to be inclusive in a manner similar to the term "comprising."

What is claimed is:

1. A double-sampled sample and hold system, comprising:
   a double-sampled sample and hold circuit operable to sample an analog signal using both a rising and falling edge of a sampling clock signal, wherein the double-sampled sample and hold circuit comprises two generally parallel sampling circuits which are selectively coupled to an operational amplifier via a switching network, wherein each of the sampling circuits comprises a sampling capacitor which is operable to sample the analog signal in accordance with one portion of the sampling clock signal, and wherein each sampling circuit is further operable to hold a previous sample value from the respective sampling capacitor in a feedback connection with the operational amplifier, and further wherein the
   switching network is operable to coordinate a sampling of the analog signal by the generally parallel sampling circuits in an alternating fashion via a plurality of clock phase signals; and
   a clock phase signal generator circuit operably coupled to the doublesampled sample and hold circuit, and operable to generate four clock phase signals, wherein two of the clock phase signals dictate a timing by which the switching network switches an operation of a respective one of the generally parallel sampling circuits between a sample mode and a hold mode, and wherein another two of the clock phase signals comprise pre-phase signals which define a sampling instant for a respective one of the generally parallel sampling circuits,
   and wherein a falling edge signal transition of each of the pre-phase signals occurs before a falling edge signal transition of a respective clock phase signal which dictates the switching network timing, and wherein a falling edge of each of the pre-phase signals is dictated by a global clock signal,
   wherein the clock phase generator subcircuit comprises:
      a latch circuit operable to generate two output signals which are complimentary to one another, and wherein a logic state of the two output signals change at a rate dictated by the global clock signal;
      a first clock signal path circuit, comprising:
         a NAND gate having an input coupled to one of the output signals of the latch circuit, and an output;
         a first inverter having an input coupled to the output of the NAND gate, and having an output;
         a second inverter having an input coupled to the output of the first inverter, and an output;
         a third inverter having an input coupled to the output of the second inverter, and an output;
         a pull-up circuit coupled to the output of the third inverter and the output of the NAND gate, and operable to pull the output of the third inverter to a high logic state when the output of the NAND gate transitions to a low logic state;
         a fourth inverter having an input coupled to the output of the third inverter, and an output; and
         a fifth inverter having an input coupled to the output of the fourth inverter, and an output which produces one of the two clock signals used for sampling;
      a second clock signal path circuit, comprising:
         a NAND gate having an input coupled to the other one of the output signals of the latch circuit, another input coupled to the output of the fourth inverter of the first clock signal path circuit, and an output;
         a first inverter having an input coupled to the output of the NAND gate, and having an output;
         a second inverter having an input coupled to the output of the first inverter, and an output;
         a third inverter having an input coupled to the output of the second inverter, and an output;
         a pull-up circuit coupled to the output of the third inverter and the output of the NAND gate, and operable to pull the output of the third inverter to a high logic state when the output of the NAND gate transitions to a low logic state;
         a fourth inverter having an input coupled to the output of the third inverter, and an output coupled to another input of the NAND gate of the first clock signal path circuit; and
         a fifth inverter having an input coupled to the output of the fourth inverter, and an output which produces the other one of the two clock signals used for sampling.

2. The double-sampled sample and hold system of claim 1, wherein the pre-phase signal generator subcircuit further comprises:
   a pulse generator circuit operable to generate a pulse having a timing which is associated with the global clock signal;
   a pull-down circuit coupled to the pulse generator circuit, and operable to pull the output of the first inverter of the first clock signal path circuit and the first inverter of the second clock signal path circuit, respectively, down to a low logic state in response to the pulse; and
   a signal delay circuit having an input coupled to the output of the first inverter of the first clock signal path circuit and the output of the first inverter of the second clock signal path circuit, respectively, and having two outputs, wherein the signal delay circuit receives signals at the outputs of the first inverters and delays the signals by a predetermined amount of time, and provides the delayed signals at the two outputs, wherein the delayed signals comprise the pre-phase clock signals.

3. The double-sampled sample and hold system of claim 2, wherein the pulse generator circuit comprises an AND logic gate circuit having one input coupled to the global clock signal and another input coupled to the global clock signal through an inverter, and having an output, wherein a pulse width of the pulse at the output of the AND gate is a function of a propagation delay of the inverter coupled thereto.

4. The double-sampled sample and hold system of claim 2, wherein the pull-down circuit comprises:
- a first transistor coupled between the output of the first inverter of the first clock signal path circuit and circuit ground, and having a control terminal coupled to the pulse generator circuit, and operable to conduct when the pulse generator circuit transmits the pulse thereto, thereby pulling the output of the first inverter of the first clock signal path circuit to circuit ground; and
- a second transistor coupled between the output of the first inverter of the second clock signal path circuit and circuit ground, and having a control terminal coupled to the pulse generator circuit, and operable to conduct when the pulse generator circuit transmits the pulse thereto, thereby pulling the output of the first inverter of the second clock signal path circuit to circuit ground.

5. The double-sampled sample and hold system of claim 2, wherein the signal delay circuit comprises:
- a first pair of series-connected inverters having an input coupled to the output of the first inverter of the first clock signal path circuit and an output; and
- a second pair of series-connected inverters having an input coupled to the output of the first inverter of the second clock signal path circuit and an output.

* * * * *